(12) United States Patent
Anderl

(10) Patent No.: US 10,542,634 B2
(45) Date of Patent: Jan. 21, 2020

(54) FAN RECONFIGURATION AND DISPLACEMENT DUE TO A FAILED OR FAILING FAN

(71) Applicant: International Business Machines Corporation, Armonk, NY (US)

(72) Inventor: William J. Anderl, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 324 days.

(21) Appl. No.: 15/430,213

(22) Filed: Feb. 10, 2017

(65) Prior Publication Data

US 2018/0235102 A1 Aug. 16, 2018

(51) Int. Cl.
  *H05K 7/20* (2006.01)
  *F04D 25/16* (2006.01)
  *F04D 29/60* (2006.01)
  *F04D 25/06* (2006.01)

(52) U.S. Cl.
  CPC ..... *H05K 7/20172* (2013.01); *F04D 25/0613* (2013.01); *F04D 25/166* (2013.01); *F04D 29/601* (2013.01); *F05D 2260/84* (2013.01)

(58) Field of Classification Search
  CPC .......... H05K 7/20172; H05K 7/2019; H05K 7/20727; F04D 25/0613; F04D 25/166; F04D 29/601; F05D 2260/84
  USPC ............................................................ 415/1
  See application file for complete search history.

(56) References Cited

U.S. PATENT DOCUMENTS

| 6,075,698 | A | 6/2000 | Hogan et al. |
| 6,860,713 | B2 | 3/2005 | Hoover |
| 6,961,248 | B2 | 11/2005 | Vincent et al. |
| 7,408,774 | B1 * | 8/2008 | Anderl ............... H05K 7/20727 174/16.1 |
| 7,675,747 | B1 * | 3/2010 | Ong ..................... F04D 19/024 361/679.46 |
| 8,320,125 | B1 | 11/2012 | Amburgen et al. |

(Continued)

FOREIGN PATENT DOCUMENTS

EP 259182 A2 3/1988

OTHER PUBLICATIONS

"Device and Method of Intentional Airflow Recirculation for Enhanced Cooling in an Electronic Enclosure During an Airmover Replacement or Missing Airmover," Disclosed Anonymously, IPCOM000240106D, Jan. 2, 2015.

*Primary Examiner* — Mahmoud Gimie
(74) *Attorney, Agent, or Firm* — ZIP Group PLLC

(57) ABSTRACT

A system which provides redundant cooling of heat generating components within an electronic system with a single row of fans out the use of counter-rotational fans or multiple rows of fan by displacing failed fans in orthogonal directions. The system includes a fan track that has an orthogonal portion and at least one parallel portion. A failed or failing fan is moved from the orthogonal portion of the fan track to the parallel portion of the fan track. A bank of fans are each upon the orthogonal portion of the track. Each fan in the bank of fans acts upon air to produce an airflow. The bank of fans includes a moved fan at least partially filling a void upon the orthogonal portion of the fan track that is created when the failed or failing fan was moved from the orthogonal portion of the fan track to the parallel portion of the fan track.

19 Claims, 7 Drawing Sheets

(56) References Cited

U.S. PATENT DOCUMENTS

| | | |
|---|---|---|
| 8,840,453 B2 | 9/2014 | Izuno et al. |
| 8,879,252 B2 * | 11/2014 | Kelaher ............. H05K 7/20727 |
| | | 361/695 |
| 8,988,877 B2 | 3/2015 | Cash et al. |
| 9,122,462 B2 | 9/2015 | Ross |
| 2003/0184968 A1 | 10/2003 | Steinman |
| 2005/0174734 A1 * | 8/2005 | Chen .................. H05K 7/20172 |
| | | 361/695 |
| 2007/0091564 A1 * | 4/2007 | Malone .............. H05K 7/20727 |
| | | 361/695 |
| 2013/0100613 A1 * | 4/2013 | Nakai ................ H05K 7/20563 |
| | | 361/695 |
| 2016/0044820 A1 * | 2/2016 | Xu ....................... H05K 7/1487 |
| | | 361/679.31 |
| 2016/0183406 A1 | 6/2016 | Ragupathi et al. |
| 2017/0082112 A1 * | 3/2017 | Barron .................. F04D 27/004 |

\* cited by examiner

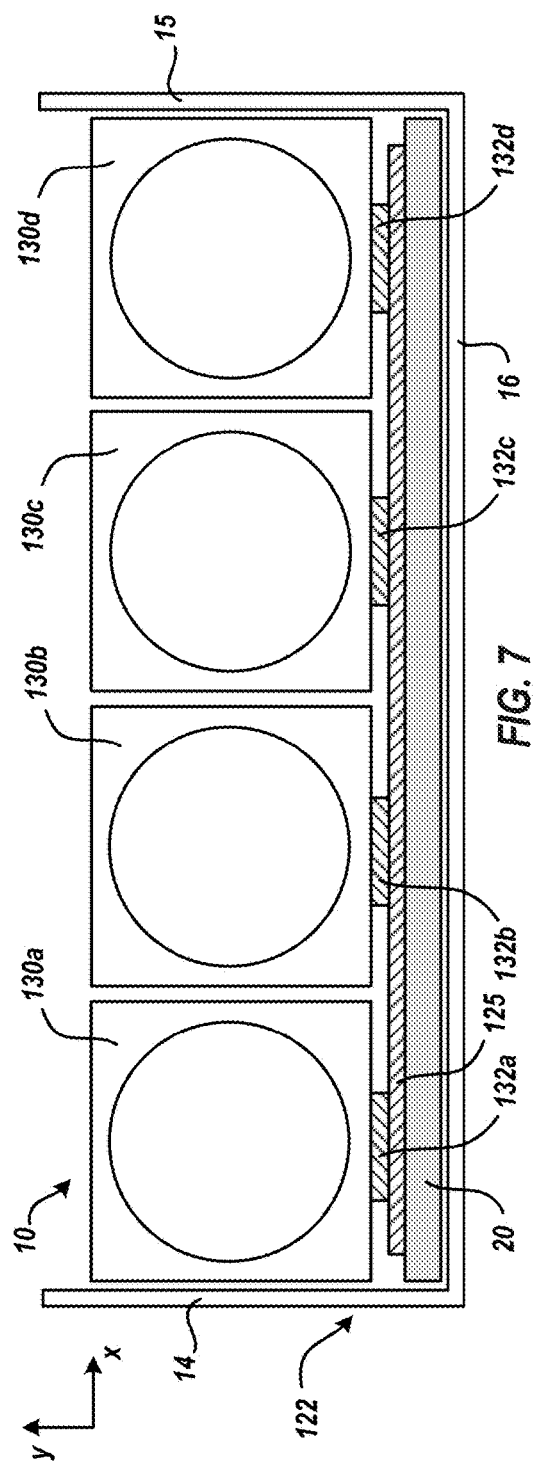
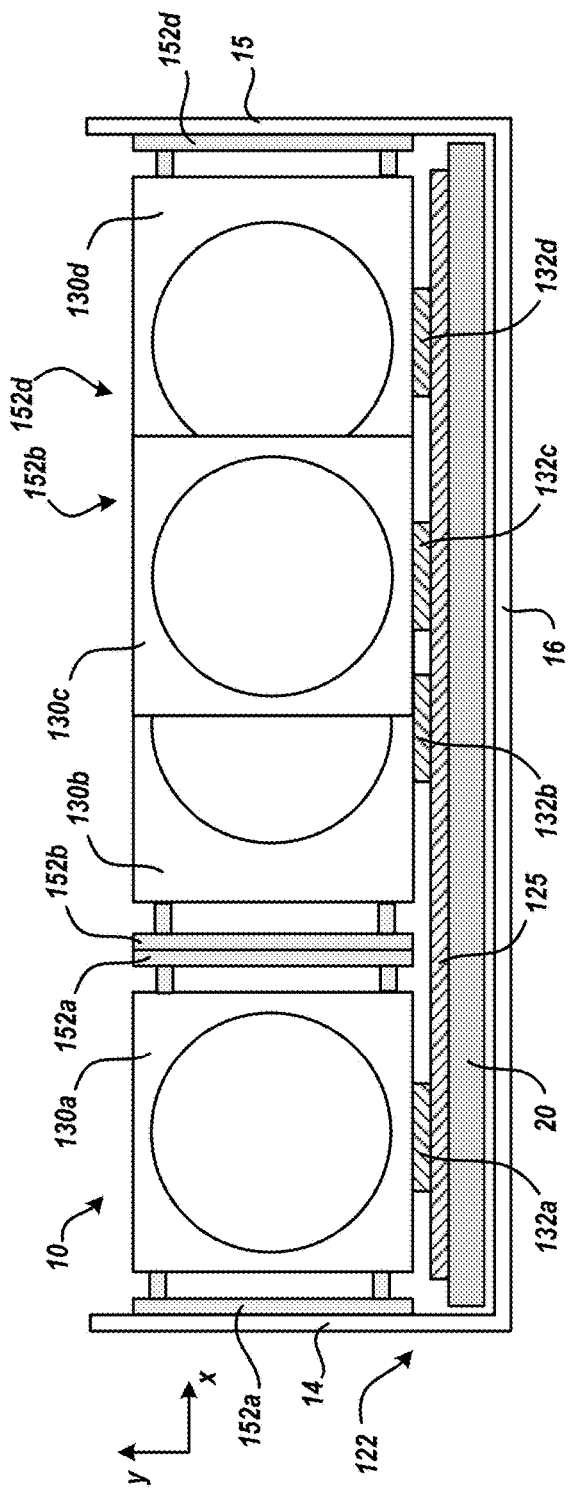

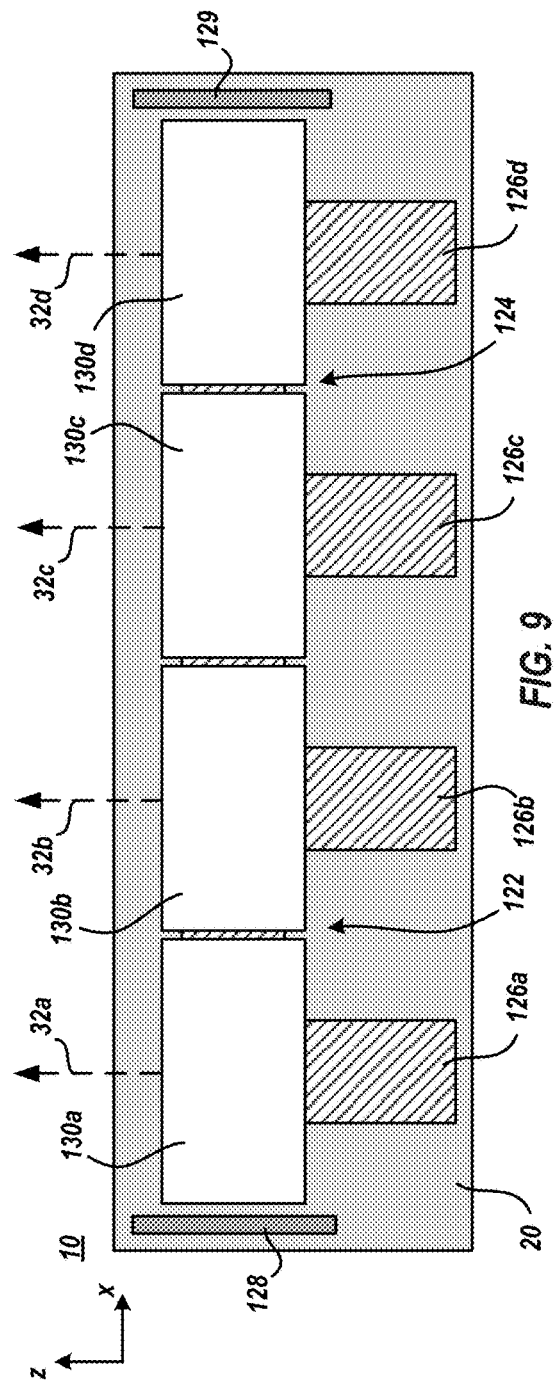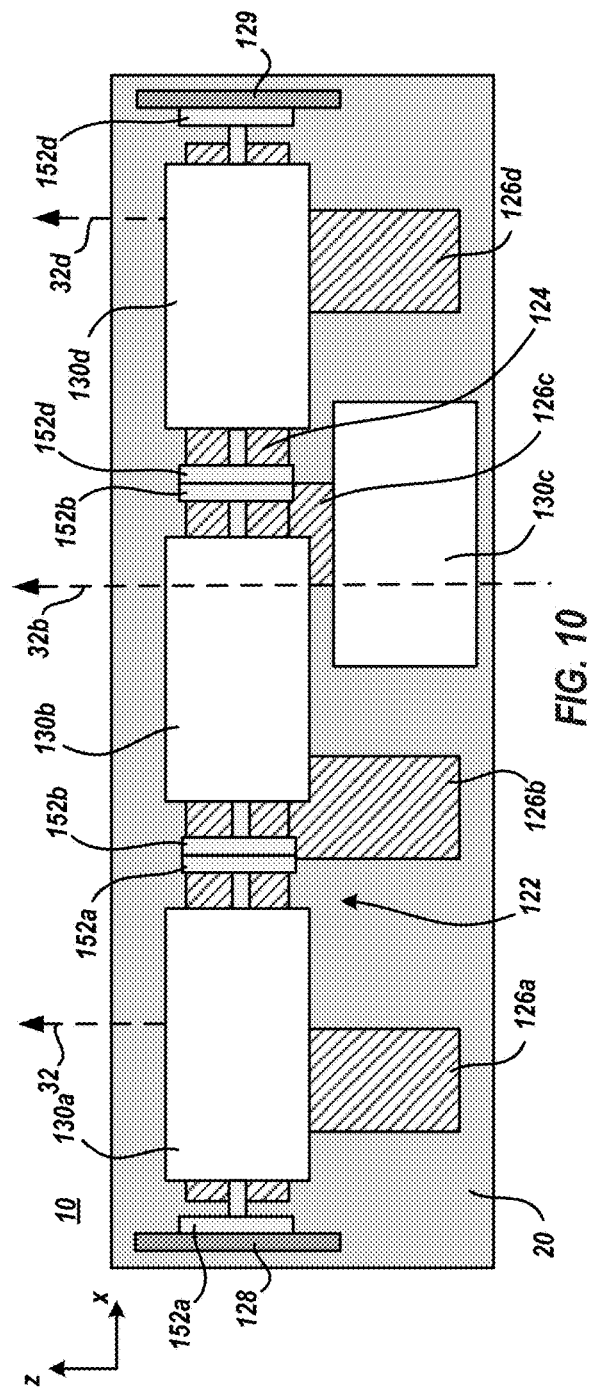

FAN RECONFIGURATION AND DISPLACEMENT DUE TO A FAILED OR FAILING FAN

FIELD OF THE INVENTION

Embodiments of the invention generally relate to electronic systems and more particularly a fan system that is reconfigurable to cool an electronic system by displacing fans upon a track in orthogonal directions.

DESCRIPTION OF THE RELATED ART

Electronic systems typically convert electrical energy to thermal energy by their operation. To cool an electronic system, one or more fans may propel ambient or cooled air across heat generating components of the electronic system, such as processor, memory, or the like. It is beneficial for some electronic systems to employ redundant fan cooling to adequately cool the heat generating components even if one or more of the fans completely fails or is failing. It is difficult to achieve adequate cooling downstream of a failed or failing fan, especially if the failed or failing fan is located on either end of a single bank of fans.

SUMMARY

In an embodiment of the present invention, a method of redundantly cooling a heat generating component within an electronic system by displacing fans within a redundant fan system in orthogonal directions is presented. The method includes moving a failed or failing fan within a bank of fans against a parallel portion of the fan track. The parallel portion of the fan track is parallel to an airflow discharge vector of airflow produced by an operational fan within the bank of fans. The method further includes moving the operational fan within the bank of fans against a orthogonal portion of the fan track. The orthogonal portion of the fan track is orthogonal to the parallel portion.

A system that redundantly cools a heat generating component within an electronic system by displacing fans in orthogonal directions is presented. The system includes a bank of fans upon an orthogonal portion of a fan track. Each fan of the bank of fans acts upon air to produce an airflow having an airflow discharge vector. The fan track includes the orthogonal portion and at least one parallel portion. The parallel portion of the fan track is parallel to each of the airflow discharge vectors and the orthogonal portion of the fan track is orthogonal to the parallel portion. The system further includes a failed or failing fan moved from the orthogonal portion of the fan track to the parallel portion of the fan track. A void exists upon the orthogonal portion of the fan track upon the failed or failing fan being moved to the parallel portion of the fan track. The bank of fans includes a moved fan at least partially filling the void upon the orthogonal portion of the fan track.

In yet another embodiment of the present invention, an electronic system that has a redundant fan system that cools a heat generating component within the electronic system by displacing fans in orthogonal directions is presented. The electronic system includes a bank of fans upon an orthogonal portion of a fan track. Each fan of the bank of fans acts upon air to produce an airflow having an airflow discharge vector. The fan track includes the orthogonal portion and at least one parallel portion. The parallel portion of the fan track is parallel to each of the airflow discharge vectors and the orthogonal portion of the fan track is orthogonal to the parallel portion. The system further includes a failed or failing fan moved from the orthogonal portion of the fan track to the parallel portion of the fan track. A void exists upon the orthogonal portion of the fan track upon the failed or failing fan being moved to the parallel portion of the fan track. The bank of fans includes a moved fan at least partially filling the void upon the orthogonal portion of the fan track.

These and other embodiments, features, aspects, and advantages will become better understood with reference to the following description, appended claims, and accompanying drawings.

BRIEF DESCRIPTION OF THE DRAWINGS

FIG. 7 illustrates a partial planar view of an exemplary electronic system that has a redundant fan system with a failed or failing fan prior to displacing fans of the redundant fan system, according to one or more embodiments of the present invention.

FIG. 8 illustrates a partial planar view of an exemplary electronic system that has a redundant fan system with a failed or failing fan subsequent to displacing fans of the redundant fan system, according to one or more embodiments of the present invention.

FIG. 9 illustrates a partial normal view of an exemplary electronic system that has a redundant fan system with a failed or failing fan prior to displacing fans of the redundant fan system, according to one or more embodiments of the present invention.

FIG. 10 illustrates a partial normal view of an exemplary electronic system that has a redundant fan system with a failed or failing fan subsequent to displacing fans of the redundant fan system, according to one or more embodiments of the present invention.

DETAILED DESCRIPTION

Embodiments of the invention relate to a system that redundantly cools a heat generating component within an electronic system by displacing fans in orthogonal directions. The system includes a fan track that has an orthogonal portion connected to at least one parallel portion. The orthogonal portion is orthogonal to the direction of one or more airflow discharge vector(s) of one or more fans upon the orthogonal portion. The parallel portion is parallel to the direction of the airflow discharge vector(s). A failed or failing fan is moved from the orthogonal portion of the fan track to the parallel portion of the fan track. A bank of fans are each upon the orthogonal portion of the track. Each fan in the bank of fans acts upon air to produce an airflow. The bank of fans includes a moved fan at least partially filling a void upon the orthogonal portion of the fan track that is created when the failed or failing fan was moved from the orthogonal portion of the fan track to the parallel portion of the fan track.

Figure 1:
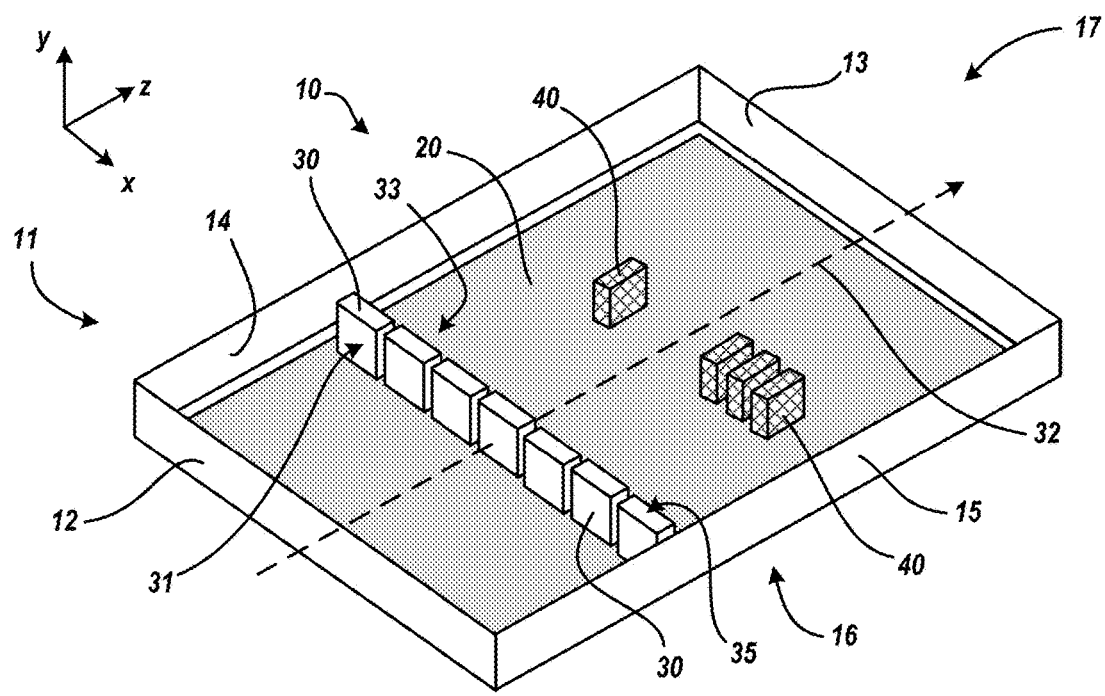
FIG. 1 illustrates a partial isometric view of an exemplary electronic system that is cooled by fans, according to one or more embodiments of the present invention.

Referring to the Drawings, wherein like numbers denote like parts throughout the several views, FIG. 1 illustrates a partial isometric view of an exemplary electronic system 10 that is cooled by fans 30. Electronic system 10 includes a housing 11 and system board 20. Housing 11 is the electronic system case, also known as a chassis, tower, system unit, cabinet, base unit, and is generally the enclosure that contains internal components the electronic system 10.

Housing 11 may be fabricated from steel, aluminum, plastic, or the like. Housing 11 may include an air inlet sidewall 12, an air exhaust sidewall 13, a port side-wall 14, a starboard sidewall 15, a bottom 16, and a cover 17 (not shown). Housing 11 may also include enclosures for components, such as a power supply unit, and drive bays. Housing 11 may also have a power button or switch, a reset button, and LEDs to indicate power as well component activity.

The system board 20 may be mounted to housing 11 upon a large surface area, such as bottom 16, but could be a sidewall depending on the form factor and orientation of the housing 11. Air inlet sidewall 12 includes airflow perforations to allow cool or ambient air to enter housing 11 to cool one or more heat generating components 40 upon system board 20. Air exhaust sidewall 13 also includes airflow perforations to allow air heated by one or more heat generating components 40 to leave housing 11. Air inlet sidewall 12 and/or air exhaust sidewall 13 may further include cut-out holes to expose ports or portions of components within housing 11.

Cover 17 may include an access panel to allow a user to access one or more fans 30 and may be closed during normal system 10 operation but may be opened to allow the user to service one or more fans 30. The user may also, or alternatively, remove cover 17 from system 10 to allow the user to service one or more fans 30.

System board 20 may also be referred to as a mainboard, system board, baseboard, planar board or logic board and is the main printed circuit board (PCB) within electronic system 10. System board 20 includes one or more heat generating components 40 and holds and allows communication between many of the crucial electronic components of a system 10, such as a central processing unit (CPU) and memory, and provides connectors for other peripherals. The system board 20 may further include sub-systems such as the CPU's input/output controller or memory controller, interface connectors, or the like. Heat generating component 40 is an electrical component within housing 11 that utilizes electrical energy to operate or function and resultantly generates heat. Heat generating component 40 may be the CPU, memory, or the like.

One or more fans 30 are included in housing 11 to generate an airflow 32 that exhausts from fan 30 in the direction and velocity of an airflow discharge vector that is coincident with the axis of rotation of the fan 30 impeller. For clarity, the airflow discharge vector of a fan is the direction and velocity of the airflow crated by that fan. The airflow 32 is created from the air inlet sidewall 12 to the air exhaust sidewall 13 to transfer heat, directly or indirectly, from heat generating component(s) 40 to airflow 32. Direct heat transfer is utilized herein to describe the transfer of heat from the heat generating component 40 to airflow 32 with no intervening heat transfer interfaces. For example, a dual inline memory module (DIMM) may be cooled by airflow 32 impinging upon or flowing across its memory modules. Indirect heat transfer is utilized herein to describe the transfer of heat from an intermediary that is heated by heat generating device 40 to airflow 32. For example, a processor may be indirectly cooled by the airflow 32 impinging upon or flowing across a heat sink attached to the processor.

The fans 30 may be aligned in a single bank of fans 30 such that surfaces 31, 33, and/or 35 of each fan are respectively coplanar. For example, a single bank of fans 30 is created if each fan 30 surface 33 is coplanar. When each fan 30 surface 33 is coplanar the respective axis of rotation of each fan 30 blade may be parallel and as such, airflow 32 from each fan may be parallel. When airflow 32 from each fan 32 is parallel, a single airflow 32 may be depicted within the drawings.

Figures 2A, 2B:
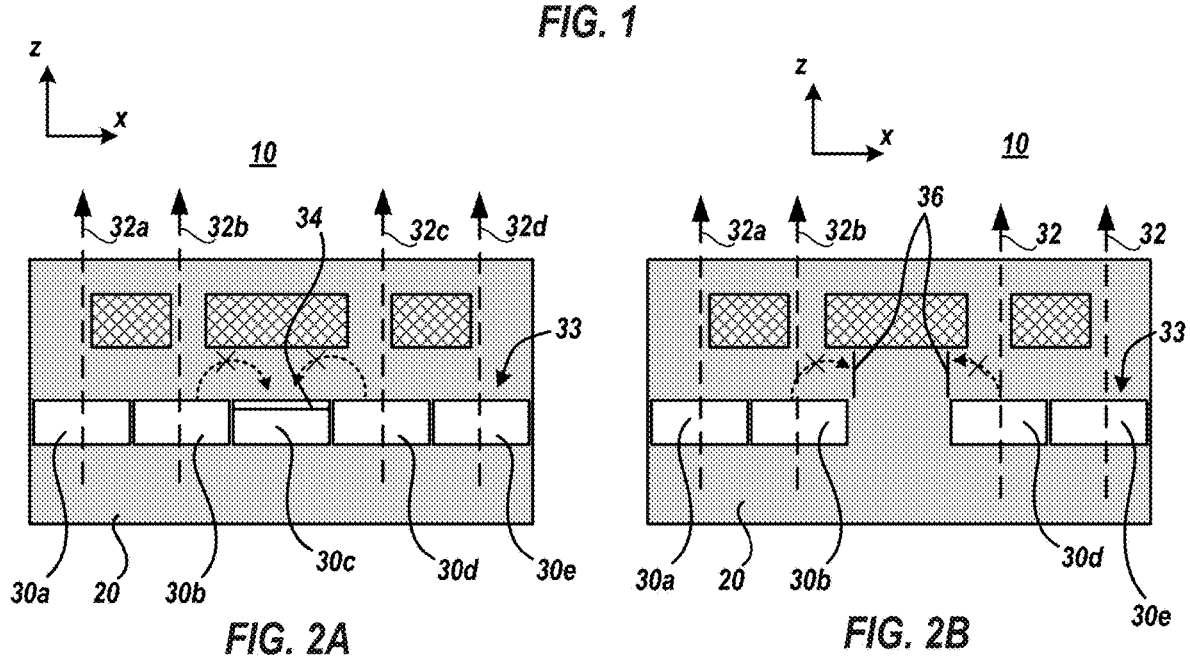
FIG. 2A and FIG. 2B illustrate partial normal views of an exemplary electronic system that has a failed or failing fan, according to one or more embodiments of the present invention.

FIG. 2A and FIG. 2B illustrate partial normal views of electronic system 10 that has a failed or failing fan 30c. The term normal view is utilized herein to include a top view or bottom view of the depicted features as is applicable. The term planar view is utilized herein to include a front view or rear view of the depicted features as is applicable.

FIG. 2A depicts electronic system 10 with a failed or failing fan 30c that includes an anti-recirculation membrane 34 that blocks airflow 32a, 32b, 32d, and 32e from flowing from the exhaust side of fan 30a, 30b, 30d, and 30e, respectively, to the inlet side of the fans through the failed or failing fan 30c. By utilizing an anti-recirculation membrane 34 within fans 30, the direction of airflow 32 of the functioning fans 30 is generally maintained. However, anti-recirculation membranes 34 generally decreases the efficiency of the fans in which they are included since the anti-recirculation membranes 34 impedes air flow from those fans through the electronic system.

The term failed or failing fan is defined herein to be a fan that produces no airflow 32 or that produces an airflow 32 below its operational volumetric flow rate. The operational volumetric flow rate for each fan is the minimum volumetric flow rate that each fan needs to produce to achieve overall adequate cooling of the electronic system 10. Each operational volumetric flow rate for each fan within the electronic system may be the same or may be different.

FIG. 2B depicts electronic system 10 that includes an anti-recirculation louver 36 that directs air toward the exhaust sidewall 13 by blocking airflow 32a, 32b, 32d, and 32e from flowing from the exhaust side of fan 30a, 30b, 30d, and 30e, respectively, to the inlet side of the fans through a void created by the removal of the failed or failing fan 30c. By utilizing one or more anti-recirculation louvers 36, the direction of airflow 32 of the functioning fans 30 is generally maintained. However, anti-recirculation louver 36 generally decreases the efficiency of the fans since the anti-recirculation louver 36 impedes air flow from the fans through the electronic system.

Cooling redundancy may be added to electronic systems by utilizing counter rotating fans. Such fans include two blades that rotate around the same axis of rotation in opposite directions. When one blade fails to rotate, or does not rotate at a sufficient rpm, the functionality of the other blade may be maintained to produce an air flow to adequately cool the electronic system. Cooling redundancy may also be added to electronic systems by utilizing multiple banks of serialized fans. For example, two banks of fans may be utilized such that a fan in the first bank and a fan in the second bank share an axis of rotation. When the blade in one of these serialized fans fails to rotate, or does not rotate at a sufficient rpm, the functionality of the other blade in the other serialized fan may be maintained to produce an air flow to adequately cool the electronic system.

There are conditions where airflow can be drawn or pulled through a non-functional fan more efficiently than pushing airflow through a non-functional fan. As such, the drawback from having multiple banks of serialized single rotor fans is that there is a likelihood that the failed fan will be downstream of the airflow. Thus, in such system the airflow may be necessarily pushed through a non-functional fan. Likewise, because counter rotational fans have different cooling abilities depending on which of the two rotors fail, there is also a likelihood that the failed fan will be downstream of the airflow. The failed rotor within the counter rotating fan and the failed fan in the multiple bank of serialized fans may decrease the efficiency of the fans since the failed features may impede air flow from the functional features. In other words, there is typically no mechanism to ensure that the failed or failing serialized fan or the failed or failing blade within the counter rotating fan is located upstream of the functioning serialized fan or the functioning fan blade within the counter rotating fan.

Figure 3:
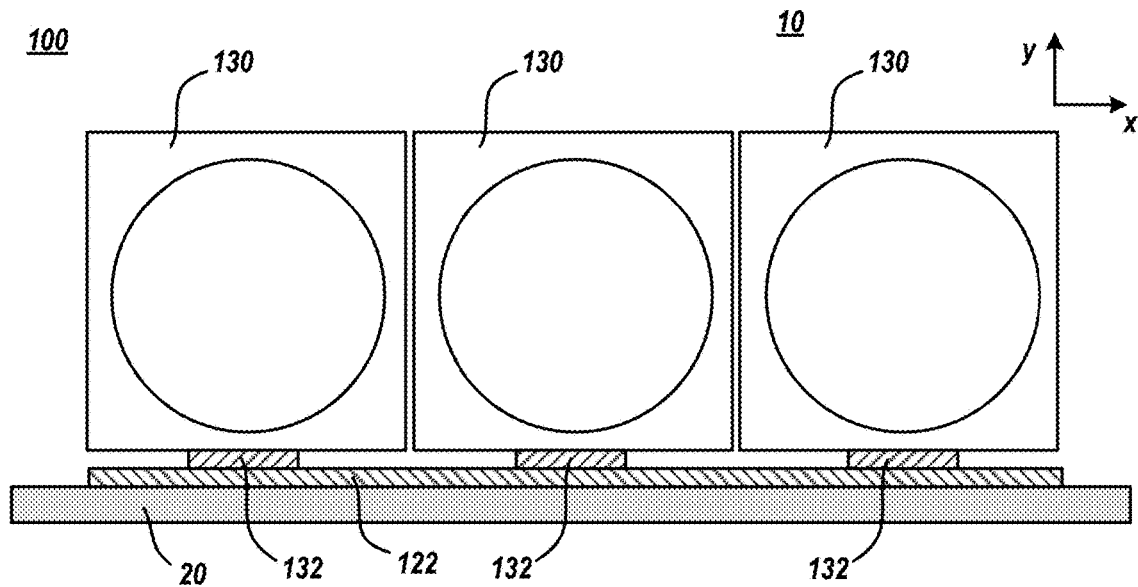
FIG. 3 illustrates a partial planar view of an exemplary electronic system that has a redundant fan system, according to one or more embodiments of the present invention.

FIG. 3 illustrates a partial planar view of electronic system 10 that has a redundant fan system 100. Redundant fan system 100 includes multiple fans 130 that are displaceable relative to system board 20 upon a fan coupler 132 movingly engages against a fan track 122. When a fan 130 fails, or is failing, the failed or failing fan 130 may displaced upon track 122 in a direction parallel with and upstream of air flow 32. In an alternative implementation, the failed or failing fan 130 may be moved in a direction parallel with and downstream of air flow 32. One or more of the other functional fans 130 within system 100 may be subsequently displaced upon track 122 in a direction orthogonal to air flow 32. As such, system 100 offers a mechanism to ensure that the failed or failing fan 130 is located upstream of a functional fan that has been displaced to provide redundant cooling for the failed or failing fan. In embodiments, the displaced functional fan may also include one or more anti-recirculation extensions that are located upstream of the outlet of the displaced functional fan so as to not impede the airflow 32 of the displaced functional fan. In an embodiment, track 122 is distinct (i.e. removeable) from and connectable to system board 20. In another embodiment, track 122 is integral to system board 20. In this embodiment, track 122 may be a receptacle within the system board 20.

Generally, fan coupler 132 may be located on the bottom side of fan 130 or the upper side of fan 130. When fan coupler 132 is located on the bottom side of fan 130, track 122 may be located upon system board 20, contact, directly or indirectly system board 20, or the like, as is exemplarily shown in FIG. 3. In this implementation, fan coupler 132 is located on the lower portion of fan 130 between the fan 130 and the system board 20. When fan coupler 132 is located on the upper side of fan 130, the track 122 is also located above the fan 130. In these implementations track 122 may be located upon the underside of cover 17, contact, directly or indirectly the underside of cover 17, or the like. When the fan coupler 132 is located on the upper side of fan 130, the track 122 may alternatively be located upon a support member that is fixedly attached to housing 11 or is fixedly attached to system board 20.

Figure 4:
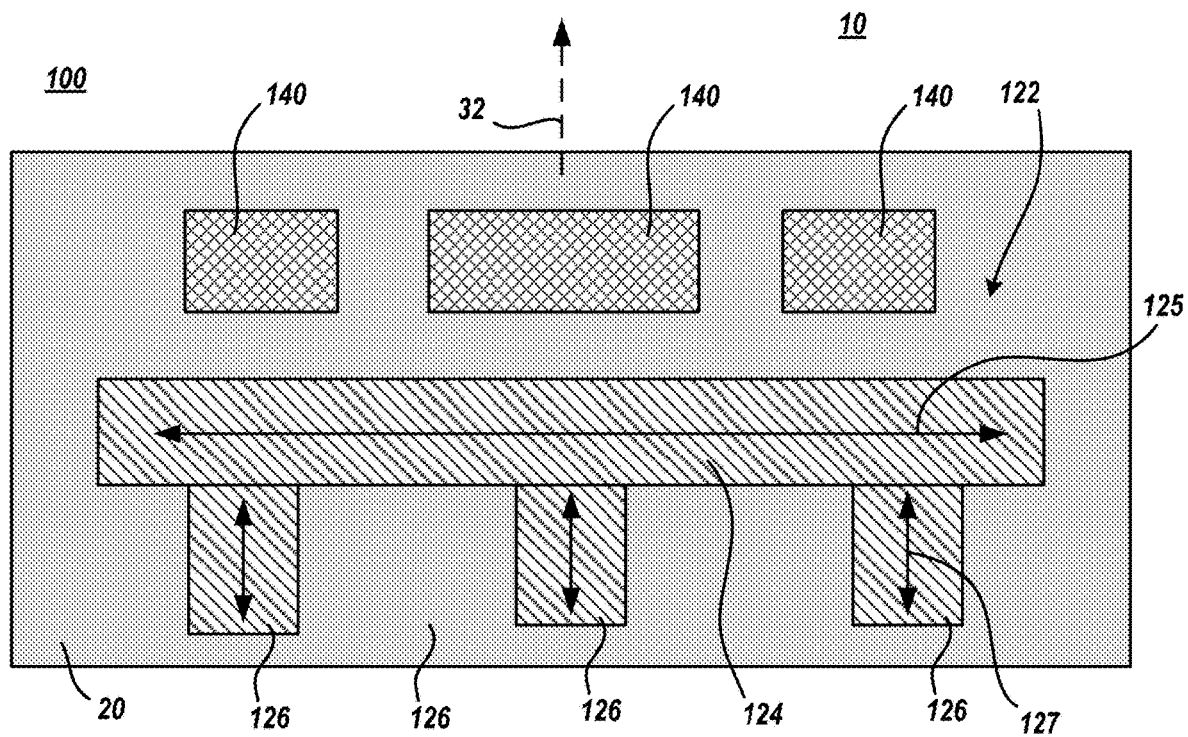
FIG. 4 illustrates a partial normal view of an exemplary electronic system that has a redundant fan system, according to one or more embodiments of the present invention.

FIG. 4 illustrates a partial normal view of exemplary electronic system 10 that has redundant fan system 100. Track 122 includes an orthogonal portion 124 connected to multiple parallel portions 126. Track 122 is a guide that engages with fan coupler 132 of fans 130 to limit the movement of fans 130 to only direction 125 upon or within orthogonal portion 124 and to limit the movement of fan 130 to only direction 127 upon or within parallel portions 126. Track 122 may be protrusion structure, such as a rail, or the like, that is accepted by fan coupler 132 of fan 130. In this embodiment, fan coupler 132 may include orthogonal tunnels such that one tunnel accepts portion 124 of the protrusion structure and the other tunnel accepts portion 124 of the protrusion structure when aligned. Alternatively, track 122 may be a receptacle structure, such as a tunnel, passage, or the like, that accepts fan coupler 132 of fan 130. In this embodiment, fan coupler 132 may be a cam, bearing, or the like that is accepted by the receptacle structure. Generally, fan coupler 132 is a structure of fan 130 that engages with track 122 so that the fan 130 may move against parallel portions 126 and orthogonal portion 124.

Generally, fan 130 does not move against parallel portion 126 unless fan 130 is aligned with parallel portion 126. As such, in a preferred embodiment, there is a parallel portion 126 aligned with each fan 130 upon orthogonal portion 124 prior to displacing any of the fans upon orthogonal portion 124 in direction 125. In other words, initially before any displacement of fans 130, each fan's 130 axis of rotation bisects the parallel portion 126 associated therewith.

Direction 125 is generally orthogonal to the airflow discharge vector of airflow 32 and may be parallel with air inlet sidewall 12 and/or air exhaust sidewall 13. Direction 127 is generally parallel with the direction of airflow discharge vector of airflow 32 and may be parallel with port side-wall 14 and/or starboard sidewall 15. Direction 125 is generally orthogonal to direction 127.

Figure 5:
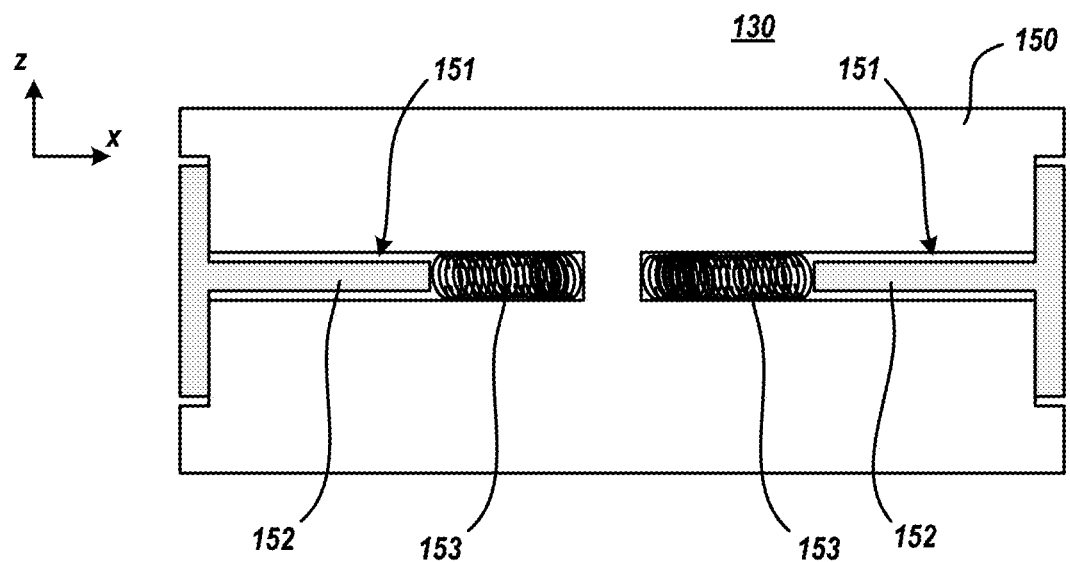
FIG. 5 illustrates a partial cross section view of a fan of a redundant fan system that includes an extension frame in an internal position, according to one or more embodiments of the present invention.

FIG. 5 illustrates a partial cross section view of fan 130 of redundant fan system 100. Fan 130 includes a fan housing 150, one or more extension frame shafts 151, one or more extension frames 152, and one or more springs 153.

Fan 130 is a single impeller fan that creates air flow 32 in the direction of it's airflow discharge vector that is coincident with the axis of rotation of the impeller. Fan 130 includes a rotating arrangement of vanes or blades which act on cooled or ambient air. The rotating assembly of blades and hub is may be referred to as a rotor, a runner, and is generally referred herein as an impeller and serves as the basis to define the direction of air flow 32. The rotating assembly is contained within housing 150. The housing 150 may aid to direct air flow 32 in the direction of the airflow discharge vector and may increase safety by preventing objects from contacting the fan blades. Shaft 151 is an opening in housing 150 that accepts extension frame 152. Extension frame 152 is operational to extend from an internal position within housing 150 to an external position outside of housing 150. The internal position of extension frame 152 is that where the extension frame is coplanar with the side surface of housing 150, as is shown in FIG. 5, or recessed within the side surface of housing 150. The external position of extension frame 152 is that where the extension frame 152 is beyond the side surface of housing 150, as is exemplary shown in FIG. 6. Spring 153 contacts housing 150 and extension frame 152 and is compressed when extension frame 152 is in the internal position and becomes increasingly relaxed as the extension frame 152 moves towards the external position.

Figure 6:
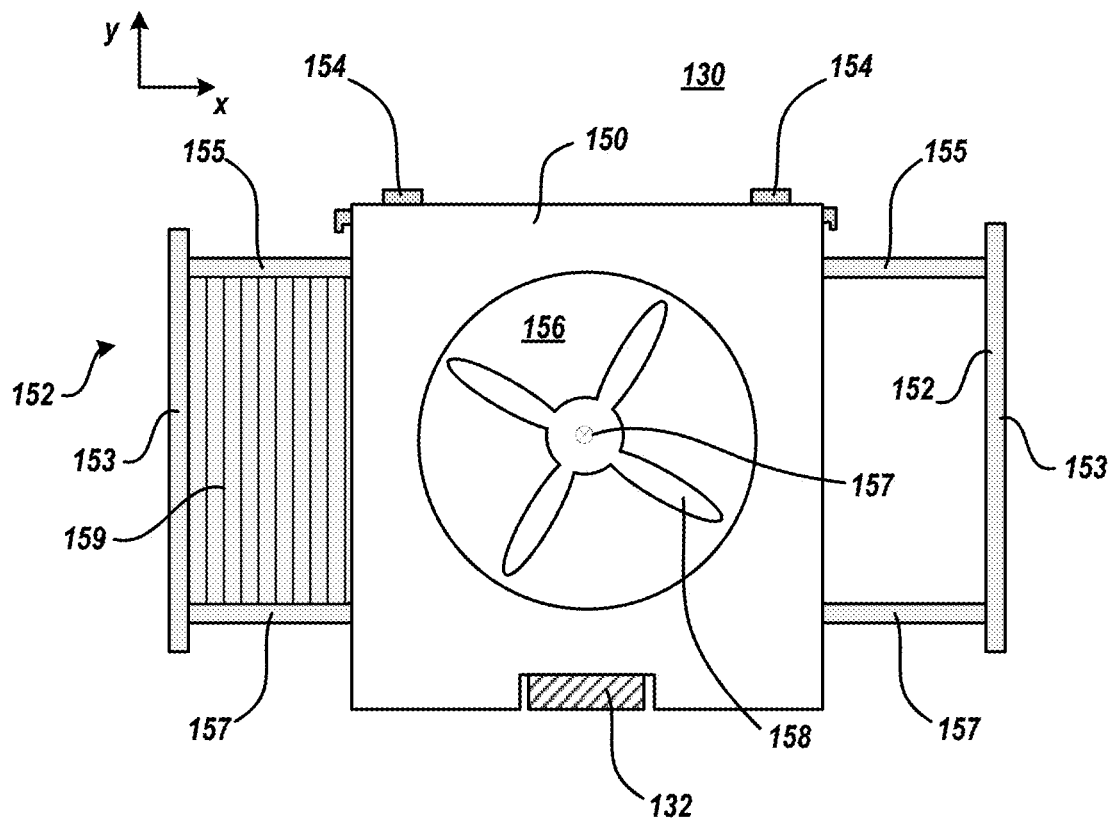
FIG. 6 illustrates a partial planar view of a fan of a redundant fan system that includes an extension frame that has moved toward an external position, according to one or more embodiments of the present invention.

FIG. 6 illustrates a partial planar view of fan 100 of redundant fan system 100. Fan 130 may further include one or more latches 154, an opening 156, and impeller 157, and one or more anti-recirculation fillers 159. Latch 154 is a retainer than retains extension frame 152 in the internal position until the latch 154 is engaged, pushed, or the like, by a user, whereupon thereby extension frame 152 move towards the external position due to the spring force of spring 153.

Housing 150 includes a central opening 156 that contains the impeller 157. The central opening 156 may be circular shaped, as is depicted in FIG. 6, with the circle foci located upon the axis of rotation of impeller 157. In an embodiments, housing 150 may be configured to minimize air-gaps between fans 130 in a bank of fans, between the underside of fan 130 and the system board 20, between the side of fan 130 and the sidewalls 14, 15 of housing 11, and/or between the top of fan 130 and cover 17 of housing 11. The fan 130 and the track may be filled with extending the housing of the fan down around the fan coupler to block and airflow leakage under the fan between it and the track 122.

Extension frame 152 may include an upper rod 155, lower rod 157, and flange 153. Upper rod 155 may have a square, rectangular, circular, or the like, cross sectional shape and is accepted by an upper shaft 151 of housing 150. Likewise, lower rod 155 may have a square, rectangular, circular, or the like, cross sectional shape and is accepted by a lower shaft 151 of housing 150. Flange 153 is a projecting rim, collar, or the like that increases the side surface area of extension frame 152, relative to the cross sectional area of upper rod 155 and lower rod 157. Flange 153 is connected to upper rod 155 and/or lower rod 157.

Latch 154 may engage the side surface area of flange 153 to retain extension frame 152 in the internal position. Anti-recirculation filler 159 is a serpentine, rolled, compressible, or the like, membrane that is compressed within extension frame 152 when extension frame 152 is in the internal position and extends as a space-filler within the extension frame 152, between the side surface of housing 150, upper rod 155, lower rod 157, and flange 153, when the extension frame 152 moves toward the external position. One side of the anti-recirculation filler 159 may be connected to housing 150 and an opposing side of the anti-recirculation filler 159 may be connected to flange 153. In some implementations, the area that anti-recirculation filler 159 and associated extension frame 152 are designed to maximized the area of anti-recirculation filler 159 within the confines of the electronic system 10 to ensure anti-recirculation of airflow 32 through the system 10.

FIG. 7 illustrates a partial planar view of electronic system 10 that includes a failed or failing fan 130c, prior to displacing fans 130a, 130b, 130c, and 130d. FIG. 8 illustrates a partial planar view of the electronic system 10 after displacing fans 130a, 130b, 130c, and 130d. Referring to FIG. 7 and FIG. 8 simultaneously, during normal operation of electronic system 10, a single bank of fans 130a, 130b, 130c, and 130d each act upon cooled or ambient air to generate a respective airflow 32a, 32b, 32c, and 32d, which may be collectively referred to as air flow 32. The single bank of fans may be created by positioning the fans 130a-130d so that each fan's surface normal to the air flow 32 at the fan's exhaust side are coplanar. Parallel portions 126a, 126b, 126c, and 126d (not shown in FIG. 7 or FIG. 8) may be aligned with associated fans 130a, 130b, 130c, and 130d, such that axis of rotation of each fan bisects the parallel portions 126a, 126b, 126c, and 126d.

At a particular instance it is determined that a particular fan 130c within the bank of fans 130a, 130b, 130c, and 130d has failed or is failing and an indication, or notification, thereof may be sent to a user or technician of electronic system 10. The failed or failing fan 130c may be removed from the bank of fans 130a, 130b, 130c, and 130d by displacing fan 130c (in the direction out of the page shown in FIG. 7) and displacing at least one other of the fans 130a, 130b, or 130d (in the direction of x-axis) to create a new bank of fans 130a, 130b, and 130d that cool the heat generating component(s) 40 of electronic system 10.

The fans 130a, 130b, 130c, and 130d are displaced such that the failed or failing fan 130c and at least one other of the fans 130a, 130b, or 130d are moved against track 122. The failed or failing fan 130c is moved against parallel portion 126c of track 122 in the direction opposite of the airflow discharge vector air flow 32. The failed or failing fan 130c may alternatively be moved against parallel portion 126c of track 122 in the same direction of the airflow discharge vector air flow 32. In such embodiments, parallel portion 126c is located on the downstream side of orthogonal portion 124.

The at least one other of the fans 130a, 130b, or 130d are moved against orthogonal portion 124 of track 122 to at least partially fill the void within the bank of fans 130a, 130b, 130c, and 130d that was created when the failed or failing fan 130c is displaced upstream of the bank of remaining fans 130a, 130b, and 130d against parallel portion 126c. The at least one other of the fans 130a, 130b, or 130d are moved against orthogonal portion 124 by the extension frame 152a, 152b, and/or 152d moving from the internal position towards the external position.

For example, as is shown in FIG. 8, a left extension frame 152a of fan 130a moves from its internal position toward its external position to contact port side-wall 14 or another intermediary surface. A right extension frame 152a of fan 130a may move from its internal position toward its external position to contact a left extension frame 152b of fan 130b. The left extension frame 152b of fan 130b may be in its internal position or may have moved towards its external position. A right extension frame 152d of fan 130d may move from its internal position toward its external position to contact starboard side-wall 15 or another intermediary surface. A left extension frame 152d of fan 130d may move from its internal position toward its external position to contact a right extension frame 152b of fan 130b. The right extension frame 152b of fan 130b may be in its internal position or may have moved towards its external position.

FIG. 9 illustrates a partial normal view of electronic system 10 that includes a failed or failing fan 130c, prior to displacing fans 130a, 130b, 130c, and 130d. FIG. 10 illustrates a partial normal view of the electronic system 10 after displacing fans 130a, 130b, 130c, and 130d. Referring to FIG. 9 and FIG. 10 simultaneously, during normal operation of electronic system 10, a single bank of fans 130a, 130b, 130c, and 130d each act upon cooled or ambient air to generate a respective airflow 32a, 32b, 32c, and 32d, which may be collectively referred to as air flow 32. The single bank of fans may be created by positioning the fans 130a-130d so that each fan's surface normal to the air flow 32 at the fan's exhaust side are coplanar. Parallel portions 126a, 126b, 126c, and 126d may be aligned with respective fans 130a, 130b, 130c, and 130d, such that axis of rotation of each fan 130a, 130b, 130c, and 130d bisects the respective parallel portions 126a, 126b, 126c, and 126d.

At a particular instance it is determined that a particular fan 130c within the bank of fans 130a, 130b, 130c, and 130d has failed or is failing and an indication, or notification, thereof may be sent to a user or technician of electronic system 10. To achieve redundant cooling, the failed or failing fan 130c may be removed from the bank of fans 130a, 130b, 130c, and 130d by displacing fan 130c and at least one other of the fans 130a, 130b, or 130d to create a new bank of fans 130a, 130b, and 130d that cool the heat generating component(s) 40 of electronic system 10.

The fans 130a, 130b, 130c, and 130d are displaced such that the failed or failing fan 130c and at least one other of the fans 130a, 130b, or 130d are moved against track 122. The failed or failing fan 130c is moved against parallel portion 126c of track 122 in the direction opposite of air flow 32. The failed or failing fan 130c may alternatively be moved against parallel portion 126c of track 122 in the same direction of the airflow discharge vector air flow 32. In such embodiments, parallel portion 126c is located on the downstream side of orthogonal portion 124.

The at least one other of the fans 130a, 130b, or 130d are moved against orthogonal portion 124 of track 122 to at least partially fill the void within the bank of fans 130a, 130b, 130c, and 130d that was created when the failed or failing fan 130c is displaced upstream of the bank of remaining fans 130a, 130b, and 130d against parallel portion 126c. The at least one other of the fans 130a, 130b, or 130d are moved against orthogonal portion 124 by the one or more extension frame(s) 152a, 152b, and/or 152d moving from the internal position towards the external position.

For example, as is shown in FIG. 9, a left extension frame 152a of fan 130a moves from its internal position toward its external position to contact port structure 128 that is fixedly connected to housing 11, system board 20, or the like. A right extension frame 152a of fan 130a may move from its internal position toward its external position to contact a left extension frame 152b of fan 130b. The left extension frame 152b of fan 130b may be in its internal position or may have moved towards its external position. A right extension frame 152d of fan 130d may move from its internal position toward its external position to contact starboard structure 129 that is fixedly connected to housing 11, system board 20, or the like. A left extension frame 152d of fan 130d may move from its internal position toward its external position to contact a right extension frame 152b of fan 130b. The right extension frame 152b of fan 130b may be in its internal position or may have moved towards its external position.

In an embodiment, the at least one other of the fans 130a, 130b, or 130d are moved against orthogonal portion 124 of track 122 so as to position at least one fan (e.g. fan 130b as shown in FIG. 10) to be partially or fully upstream of the displaced failed or failing fan 130c. For example, fan 130b may be partially upstream of fan 130c if a right sidewall of fan 130b is positioned between a left sidewall of the displaced failed or failing fan 130c and a right sidewall of the displaced failed or failing fan 130c. Similarly, fan 130b may be fully upstream of fan 130c if a right sidewall of fan 130b is coplanar with a right sidewall of the displaced failed or failing fan 130c and a left sidewall of fan 130b is coplanar with a left sidewall of the displaced failed or failing fan 130c. In this way, an airflow from the one fan (e.g. airflow 32b as shown in FIG. 10) is created by fan 130b pulling air through the failed or failing fan 130c.

Figure 11:
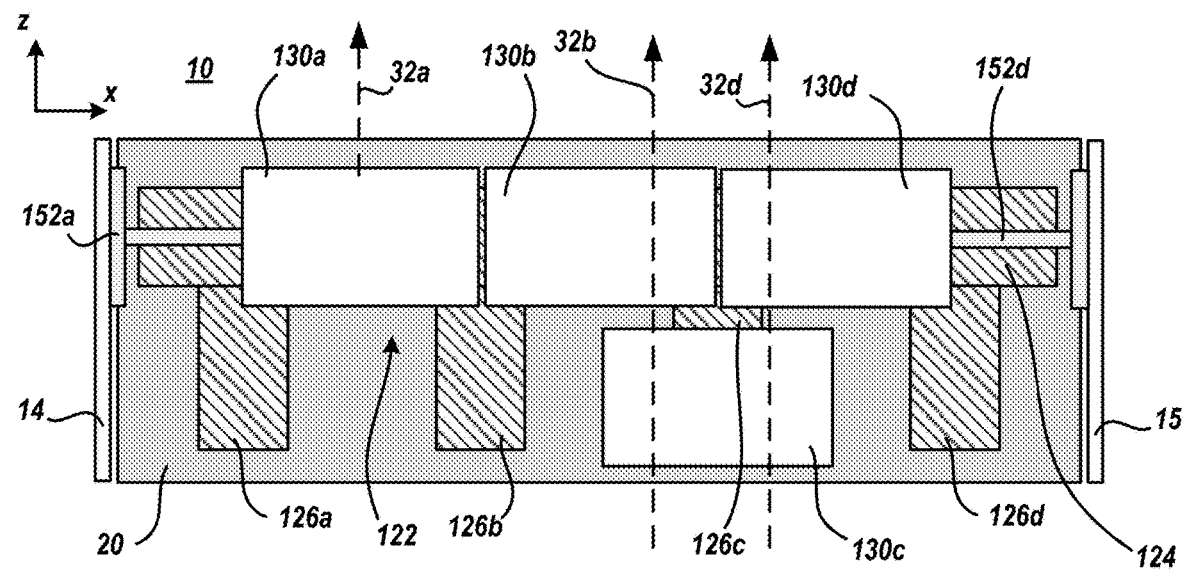
FIG. 11 illustrates a partial normal view of an exemplary electronic system that has a redundant fan system with a failed or failing fan prior to displacing fans of the redundant fan system, according to one or more embodiments of the present invention.

FIG. 11 illustrates a partial normal view of the electronic system 10 after displacing fans 130a, 130b, 130c, and 130d. At a particular instance it is determined that a particular fan 130c within the bank of fans 130a, 130b, 130c, and 130d has failed or is failing and an indication, or notification, thereof may be sent to a user or technician of electronic system 10. To achieve redundant cooling, the failed or failing fan 130c may be removed from the bank of fans 130a, 130b, 130c, and 130d by displacing fan 130c and at least one other of the fans 130a, 130b, or 130d to create a new bank of fans 130a, 130b, and 130d that cool the heat generating component(s) 40 of electronic system 10.

The fans 130a, 130b, 130c, and 130d are displaced such that the failed or failing fan 130c and at least one other of the fans 130a, 130b, or 130d are moved against track 122. The failed or failing fan 130c is moved against parallel portion 126c of track 122 in the direction opposite of air flow 32. The failed or failing fan 130c may alternatively be moved against parallel portion 126c of track 122 in the same direction of the airflow discharge vector air flow 32. In such embodiments, parallel portion 126c is located on the downstream side of orthogonal portion 124.

The at least one other of the fans 130a, 130b, or 130d are moved against orthogonal portion 124 of track 122 to at least partially fill the void within the bank of fans 130a, 130b, 130c, and 130d that was created when the failed or failing fan 130c is displaced upstream of the bank of remaining fans 130a, 130b, and 130d against parallel portion 126c. The at least one other of the fans 130a, 130b, or 130d are moved against orthogonal portion 124 by the one or more extension frame(s) 152a, 152b, and/or 152d moving from the internal position towards the external position.

For example, as is shown in FIG. 11, a left extension frame 152a of fan 130a moves from its internal position toward its external position to contact port side-wall 14. A right extension frame 152a of fan 130a is maintained in its internal position. A right and left extension frame 152b of fan 130b are maintain in their internal positions, respectively. A right extension frame 152d of fan 130d may move from its internal position toward its external position to contact starboard side-wall 15. A left extension frame 152d of fan 130d is maintained in its internal position. In this manner, the left extension fame 152a of fan 130a and the right extension frame 152d of fan 130d move the bank of fans 130a, 130b, and 130d to a centered justification within housing 11.

In an embodiment, the at least one other of the fans 130a, 130b, or 130d are moved against orthogonal portion 124 of track 122 so as to position two fans (e.g. fan 130b and 130d as shown in FIG. 11) to be partially upstream of the displaced failed or failing fan 130c. In this way, airflows from the two fans (e.g. airflow 32b and 32d as shown in FIG. 11) are created by both fan 130b and by fan 130d pulling air through the failed or failing fan 130c.

Figure 12:
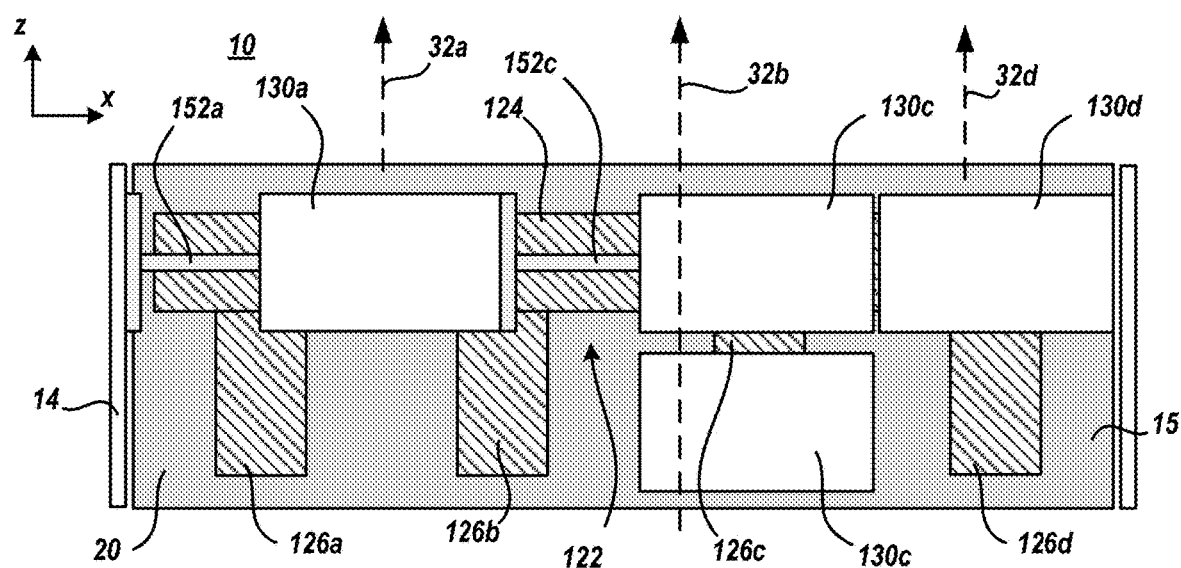
FIG. 12 illustrates a partial normal view of an exemplary electronic system that has a redundant fan system with a failed or failing fan subsequent to displacing fans of the redundant fan system, according to one or more embodiments of the present invention.

FIG. 12 illustrates a partial normal view of the electronic system 10 after displacing fans 130a, 130b, and 130c. At a particular instance it is determined that a particular fan 130c within the bank of fans 130a, 130b, 130c, and 130d has failed or is failing and an indication, or notification, thereof may be sent to a user or technician of electronic system 10. To achieve redundant cooling, the failed or failing fan 130c may be removed from the bank of fans 130a, 130b, 130c, and 130d by displacing fan 130c and at least one other of the fans 130a, 130b, or 130d to create a new bank of fans 130a, 130b, and 130d that cool the heat generating component(s) 40 of electronic system 10.

The fans 130a, 130b, and 130c are displaced such that the failed or failing fan 130c and at least one other of the fans 130a or 130b are moved against track 122. The failed or failing fan 130c is moved against parallel portion 126c of track 122 in the direction opposite of air flow 32. The failed or failing fan 130c may alternatively be moved against parallel portion 126c of track 122 in the same direction of the airflow discharge vector air flow 32. In such embodiments, parallel portion 126c is located on the downstream side of orthogonal portion 124.

The at least one other of the fans 130a and/or 130b are moved against orthogonal portion 124 of track 122 to at least partially fill the void within the bank of fans 130a, 130b, 130c, and 130d that was created when the failed or failing fan 130c is displaced upstream of the bank of remaining fans 130a, 130b, and 130d against parallel portion 126c. The at least one other of the fans 130a, 130b, or 130d are moved against orthogonal portion 124 by the one or more extension frame(s) 152a and/or 152b moving from the internal position towards the external position.

For example, as is shown in FIG. 12, a left extension frame 152a of fan 130a moves from its internal position toward its external position to contact port side-wall 14. A right extension frame 152a of fan 130a is maintained in its internal position. A left extension frame 152b of fan 130b moves from its internal position toward its external position to contact the right extension frame 152a of fan 130a. A right extension frame 152b of fan 130b is maintained in its internal position. In this manner, the left extension fame 152a of fan 130a and the left extension frame 152b of fan 130b move the fans 130a and 130b such that the bank of fans 130a, 130b, and 130d are positioned in a starboard justification within housing 11. Such positioning of the bank of fans 130a, 130b, and 130d may be beneficial if electronic system 10 includes heat generating component(s) 40 located towards the starboard side of hosing 11, includes heat generating component(s) located toward the starboard side of housing 11 that generate relatively more heat than other heat generating components 40, includes a greater density of heat generating component(s) within the starboard side of housing 11, or the like. For clarity, a similar embodiment is contemplated where the new bank of fans 130a, 130b, and 130d are positioned in a port justification within housing 11.

The system 10 design may dictate that there is one fan 130 location that always has to be functional, this would determine which fans 130a, 130b, and 130d move, the direction in which fans 130a, 130b, and 130d move, and the distance in which fans 130a, 130b, and 130d move. To achieve such results, some fans 130a-130d may not include or include an extension frame 152, may not include or include extension frame 152 only on one side of fan 130, may not include or include anti-recirculation membrane 159 within extension frame 152, or the like.

Figure 13:
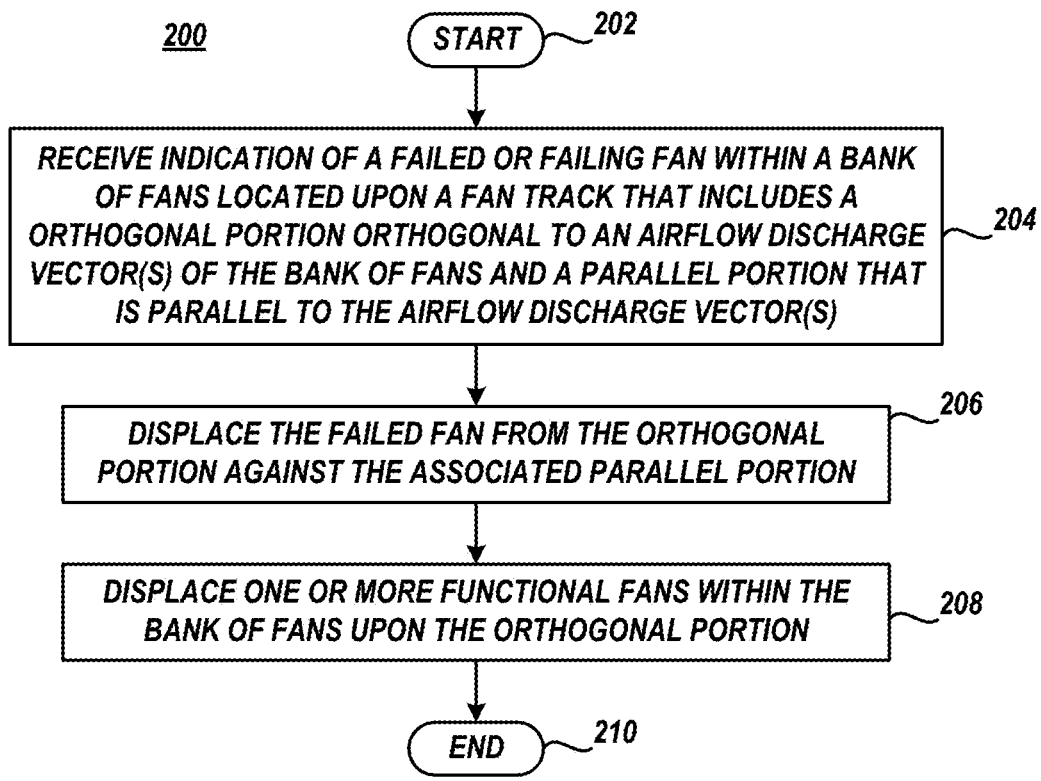
FIG. 13 illustrates a method of redundantly cooling a heat generating component within an electronic system by displacing fans within a redundant fan system in orthogonal directions, according to one or more embodiments of the present invention.

FIG. 13 illustrates a method 200 of redundantly cooling a heat generating component 40 within an electronic system 10 by displacing at least two fans 130 within redundant fan system 100 in orthogonal directions. Method 200 may be implemented by a technician or entity that services electronic system 10 in the manner directed or by an entity that allows or instructs a technician to service electronic system 10 in the manner directed. Method 200 begins at block 202 and continues with receiving an indication that a failed or failing fan exists within a bank of fans that are displaceable against a fan track 122 that includes a orthogonal portion 124 and at least one parallel portion 126 (block 204).

Method 200 may continue with displacing the failed or failing fan against the parallel portion 126 (block 206). For example, a failed or failing fan 130c may be moved against the parallel portion 126c in the direction upstream of air flow 32. In other embodiments, the failed or failing fan 130c may be moved against the parallel portion 126c in the direction downstream of air flow 32.

Method 200 may continue with displacing one or more of the other fans within the bank of fans against the orthogonal portion 124 (block 208). For example, fans 130a, 130b, and/or 130d may be moved against the orthogonal portion 124. The one or more of the other fans within the bank of fans may be moved such that these fans are starboard side justified, center justified, or port side justified within housing 11 of the electronic system 10. The one or more of the other fans within the bank of fans may be moved such that such fan(s) pull air through the displaced failed or failing fan. Method 200 ends at block 210.

Figure 14A:
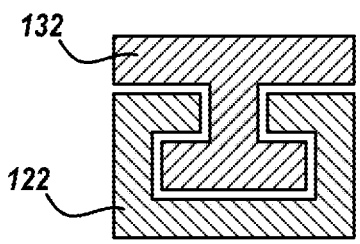
FIG. 14A and FIG. 14B illustrates exemplary cross section views of a track and a fan coupler to enable the displacement of a fan, according to one or more embodiments of the present invention.
Figure 14B:
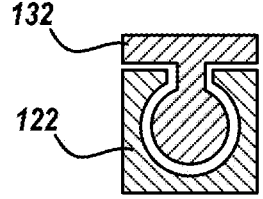

FIG. 14A and FIG. 14B illustrates exemplary cross sections of track 122 and fan coupler 132. FIG. 14A and FIG. 14B illustrate embodiments where track 122 is a receptacle structure, such as a tunnel, passage, or the like, that accepts fan coupler 132 of fan 130. In these embodiments, fan coupler 132 may be a cam, bearing, or the like that is accepted by the receptacle structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over those found in the marketplace, or to enable others of ordinary skill in the art to understand the embodiments disclosed herein.

What is claimed is:

1. An method of redundantly cooling a heat generating component within an electronic system by displacing fans within a redundant fan system in orthogonal directions, the method comprising:
    moving a failed or failing fan that is within a bank of fans in a first linear direction and against a parallel linear portion of a fan track, wherein the first linear direction and the parallel linear portion of the fan track is parallel to and upstream of an airflow discharge vector of airflow produced by an operational fan that is within the bank of fans; and
    moving the operational fan in a second linear direction and against a linear orthogonal portion of the fan track that is connected and orthogonal to the parallel portion of the fan track, wherein the second linear direction and the orthogonal linear portion of the fan track is orthogonal to the parallel linear portion.

2. The method of claim 1, wherein a void is created upon the orthogonal portion of the fan track when the failed or failing fan is moved against the parallel portion of the track.

3. The method of claim 2, wherein the operational fan moved against the orthogonal portion of the fan track at least partially fills the void.

4. The method of claim 1, wherein the operational fan moved against the orthogonal portion of the fan track pulls air through the failed or failing fan.

5. The method of claim 1, wherein moving another fan within the first bank of fans against the orthogonal portion of the fan track comprises:
moving an extension frame of the operational fan from a position internal to a fan housing of the operational fan towards a position external to the fan housing of the operational fan.

6. The method of claim 1, wherein the fan track is connected to a system board of the electronic system.

7. The method of claim 1, wherein the fan track is connected to an underside of a cover of the electronic system.

8. A system that redundantly cools a heat generating component within an electronic system by displacing fans in orthogonal directions, the system comprising:
a bank of operational fans upon a orthogonal liner portion of a fan track, each operational fan acting upon air to produce an airflow having an airflow discharge vector;
the fan track comprising the orthogonal linear portion directly connected to at least one parallel liner portion, the parallel linear portion of the fan track upstream and parallel to each of the airflow discharge vectors and the orthogonal linear portion of the fan track orthogonal to the parallel linear portion;
a failed or failing fan moved from the orthogonal linear portion of the fan track to and against the parallel linear portion of the fan track in a first linear direction that is parallel to and upstream of each of the airflow discharge vectors, wherein a void exists upon the orthogonal linear portion of the fan track upon the failed or failing fan being moved to and against the parallel linear portion of the fan track; and
the bank of fans comprising a moved operational fan moved against the orthogonal linear portion in a second linear direction that is orthogonal to the first linear direction, the moved operational fan at least partially filling the void upon the orthogonal linear portion of the fan track.

9. The system of claim 8, wherein the moved operational fan pulls air through the failed or failing fan.

10. The system of claim 8, wherein the moved operational fan comprises:
an extension frame in a position external to a fan housing of the moved fan.

11. The system of claim 8, wherein the fan track is connected to a system board of the electronic system.

12. The system of claim 8, wherein the fan track is connected to an underside of a cover of the electronic system.

13. The system of claim 8, wherein the bank of fans is center justified within the electronic system.

14. The system of claim 8, wherein the bank of fans is side justified within the electronic system.

15. An electronic system that has a redundant fan system that cools a heat generating component within the electronic system by displacing fans in orthogonal directions, the electronic system comprising:
a bank of operational fans upon a orthogonal liner portion of a fan track, each operational fan acting upon air to produce an airflow having an airflow discharge vector;
the fan track comprising the orthogonal linear portion directly connected to at least one parallel liner portion, the parallel linear portion of the fan track upstream and parallel to each of the airflow discharge vectors and the orthogonal linear portion of the fan track orthogonal to the parallel linear portion;
a failed or failing fan moved from the orthogonal linear portion of the fan track to and against the parallel linear portion of the fan track in a first linear direction that is parallel to and upstream of each of the airflow discharge vectors, wherein a void exists upon the orthogonal linear portion of the fan track upon the failed or failing fan being moved to and against the parallel linear portion of the fan track; and
the bank of fans comprising a moved operational fan moved against the orthogonal linear portion in a second linear direction that is orthogonal to the first linear direction, the moved operational fan at least partially filling the void upon the orthogonal linear portion of the fan track.

16. The system of claim 15, wherein the moved operational fan pulls air through the failed or failing fan.

17. The system of claim 15, wherein the moved operational fan comprises:
an extension frame in a position external to a fan housing of the moved fan.

18. The system of claim 15, wherein the fan track is connected to a system board of the electronic system.

19. The system of claim 15, wherein the fan track is connected to an underside of a cover of the electronic system.

* * * * *